United States Patent [19]

Takagi et al.

[11] Patent Number: 4,537,477
[45] Date of Patent: Aug. 27, 1985

[54] SCANNING ELECTRON MICROSCOPE WITH AN OPTICAL MICROSCOPE

[75] Inventors: Toshijiro Takagi; Eiji Watanabe, both of Tokyo, Japan

[73] Assignee: JEOL Ltd., Tokyo, Japan

[21] Appl. No.: 471,440

[22] Filed: Mar. 2, 1983

[30] Foreign Application Priority Data

Mar. 5, 1982 [JP] Japan .................................. 57-30940
Apr. 9, 1982 [JP] Japan .................................. 57-51532

[51] Int. Cl.³ ...................... G02B 21/00; G02B 21/06; G02B 21/26; H01J 37/26
[52] U.S. Cl. .................................. 350/507; 250/310; 350/523; 350/529
[58] Field of Search ............... 350/507, 520, 523, 529, 350/527; 250/310–311

[56] References Cited

U.S. PATENT DOCUMENTS 3,346,736 10/1967 Neuhaus .............................. 250/310
3,848,126 11/1974 Swindells et al. .................. 250/311
4,349,242 9/1982 Ogura .................................. 250/311
4,440,475 4/1984 Colliaux ............................... 250/310

FOREIGN PATENT DOCUMENTS 1439405 11/1968 Fed. Rep. of Germany ...... 250/311
3129 1/1980 Japan .................................. 250/310
55917 5/1981 Japan .................................. 350/529
185967 11/1963 Sweden .............................. 250/311
1285392 8/1972 United Kingdom ............... 350/520

Primary Examiner—William H. Punter
Attorney, Agent, or Firm—Webb, Burden, Robinson & Webb

[57] ABSTRACT

A scanning electron microscope has a specimen chamber in which there are mounted a specimen moving mechanism and an optical microscope for observing a transmission optical image of a specimen. The optical microscope includes an objective lens unit and an eyepiece unit mounted on a cover of the specimen chamber, to which the specimen moving mechanism is also attached. This arrangement facilitates switching between various modes of specimen observation on the scanning electron microscope.

5 Claims, 4 Drawing Figures

SCANNING ELECTRON MICROSCOPE WITH AN OPTICAL MICROSCOPE

Description

BACKGROUND OF THE INVENTION

The present invention relates to an improvement in an apparatus for observing a scanning electron microscope image and a transmission optical microscope image of the same specimen.

When observing cells of biological specimens, comparisons may be made between an image obtained by an optical microscope (hereinafter an "OM" and an image obtained by a scanning electron microscope (hereinafter an "SEM" ). The fields of view of both images are made coincident with each other. In this method of specimen observation, a plate of glass is coated with a thin transparent electrically conductive film and a thin specimen is mounted thereon. The specimen and plate are placed in a chamber kept at a vacuum. The OM image is obtained by illuminating the specimen with visible light. The SEM image is obtained by irradiating the specimen with an electron beam to produce backscattered electrons or secondary electrons which are detected to generate an image signal which is used to modulate the electron beam in a cathode-ray tube. It is a disadvantage, from the standpoint of maintaining a desired resolution, to increase the distance between the objective lens of the OM and the specimen. In most applications, therefore, it is customary to separate the objective lens of the OM from the eyepiece thereof, to place the objective lens in the specimen chamber close to the specimen and to place the eyepiece outside the specimen chamber. With this arrangement, however, it is quite difficult to achieve axial alignment between the eyepiece and the objective lens. Further, when a larger-size specimen is observed by the SEM, the OM and a specimen moving mechanism for OM observations must be removed from the specimen chamber for replacement with another specimen moving mechanism which is suited for observing specimens of larger sizes. This procedure is complex and cumbersome.

SUMMARY OF THE INVENTION

It is an object of the present invention to facilitate axial alignment between the objective lens and the eyepiece of an OM in an apparatus for observing OM images and SEM images. It is another object of the present invention to allow easy switching between a mode capable of observing both OM and SEM images of specimen and a mode in which SEM images of larger-size specimens are observed.

Briefly according to the present invention, there is provided a scanning electron microscope having a specimen chamber with a removable front cover. The SEM has an electron gun with a codenser lens system for converging the electron beam emitted from said electron gun to a spot on a specimen. The SEM also has a deflecting means for scanning the spot of the electron beam over the specimen. A detector for detecting backscattered or secondary electrons generates a signal in response to the scanning electron beam spot. A CRT displays an image in response to a signal generated by said detector by modulating the CRT beam which is scanned in synchronism with the electron beam spot scanning said specimen.

A specimen moving mechanism supports and positions the specimen in a specimen chamber. This mechanism is supported from said front cover. A slide support device includes an optical path for directing light to the specimen from the direction in which the electron beam irradiates the specimen.

An optical microscope having an objective lens unit is disposed in said specimen chamber for receiving light passed through the specimen. The eyepiece unit of the OM is disposed outside of the specimen chamber. The objective lens unit and said eyepiece unit are mounted to the front cover. A glass window in the cover permits the optical beam to pass from the objective lens unit to the eyepiece unit.

Preferably the slide support is also mounted on said front cover. Preferably, the slide support device has an electron detector mounted thereon for detecting backscattered and/or secondary electrons from the specimen. Movement of the slide support positions either the electron detector for the SEM mode or the light beam for the OM mode.

DESCRIPTION OF THE PREFERRED EMBODIMENTS

Figure 1:
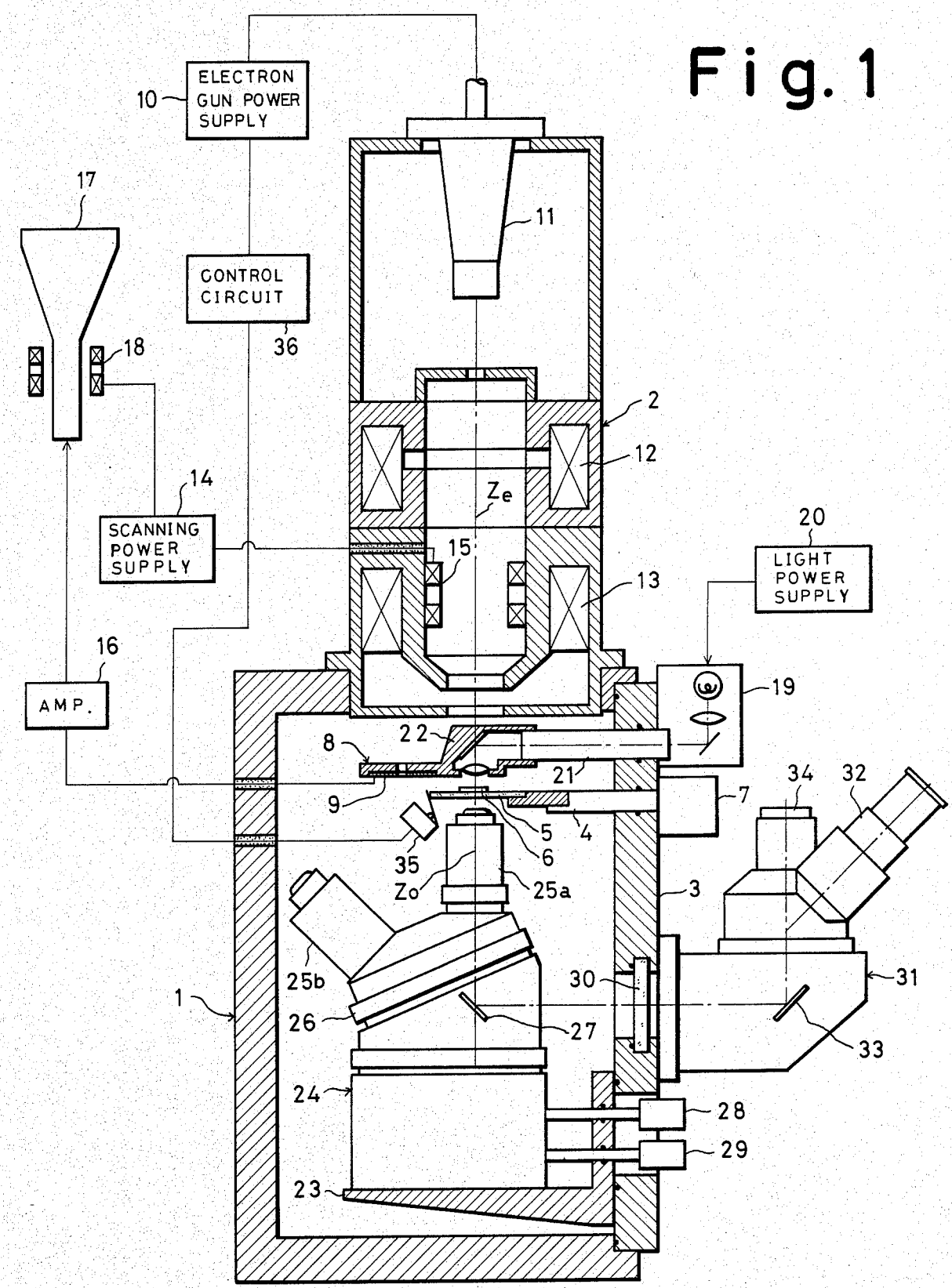
FIG. 1 is a schematic diagram, partly shown in cross section, of an apparatus according to an embodiment of the present invention.

FIG. 1 schematically illustrates an apparatus according to an embodiment of the present invention. The apparatus includes a specimen chamber 1 of an SEM with a column 2 supporting an electron optical system. The specimen chamber 1 and the column 2 are evacuated by a vacuum pump (not shown) to keep the interior of the specimen chamber 1 and the column 2 at a desired vacuum. The specimen chamber 1 has a front cover 3. A specimen moving mechanism 4 is mounted to the front cover 3 and supports a plate of glass 5 extending laterally. The distal end of the specimen moving mechanism 4 is positioned in the specimen chamber 1. The glass plate 5 is coated with a thin electrically conductive film capable of transmitting light therethrough. A thin specimen 6 is placed on an upper surface of the glass plate 5. The specimen 6 is also coated with a thin electrically conductive film to prevent the specimen 6 from being charged by electron beam irradiation. The specimen moving mechanism 4 also has a driving means 7, which is positioned outside of the specimen chamber, for moving the specimen 6 in a plane normal to an electron beam optical axis Ze. A slide support device 8 is slidably mounted on and extends through an upper portion of the cover 3. The slide support has a mirror and optical lens arranged for illuminating the specimen 6 with light from a light source external to the vacuum chamber. The slide support 8 also carries an electron beam detector 9 at its end spaced from the front cover which may be positioned adjacent the specimen. The electron beam detector 9 may comprise a semiconductor detector in the form of a ring or a plurality of segments of a ring. An electron beam opening in the slide support device 8 at the center of the detector may be brought to align with the electron beam optical axis Ze by sliding the slide support device 8 into position. After the electron beam opening is aligned with the electron beam optical axis Ze, the specimen 6 may be irradiated by the electron beam, emitted from an electron gun 11 powered by an electron gun power supply 10. The electron beam is focused by condenser lenses 12, 13 into a minute spot on the specimen 6. The beam is scanned two-dimensionally under the control of deflection coils 15 energized by a scanning power supply 14. (Only the coils for scanning the beam in one of the two directions are shown in the drawing to promote simplicity of the drawing.) Some electrons are backscattered from the specimen 6 and detected by the electron beam detector 9, and the generated signals are used to modulate the electron beam in a cathode-ray tube 17 via an amplifier 16 to control brightness. The cathode-ray tube 17 has deflection coils 18 supplied with scanning signals from the scanning power supply 14. Accordingly, an SEM image (a reflected electron image) can be displayed on the screen of the cathode-ray tube 17.

The slide support 8 cooperates with a light source 19 in which a lamp, lens and a reflecting mirror are placed. The lamp is powered by light power supply 20. When the slide support 8 is located in the illustrated position, light from the light source 19 is passed through a light guide 21, reflected by a light reflector 22, focused by a lens and illuminates the specimen 6 in the direction of the electron beam optical axis Ze.

An objective lens unit 24 of an OM is mounted on a support member 23 on a lower portion of the cover 3. The objective lens unit 24 has a plurality of objective lenses 25a, 25b having different magnifications. A turret mechanism 26 exchanges one lens for another. Reflecting mirror 27 directs the beam to the eyepiece unit 31. One of the objective lenses at a time (25a, for example) is positioned so that its optical axis Zo is aligned with the electron beam optical axis Ze. A driver 28 for driving the turret mechanism 26 and a driver 29 for adjusting the focal lengths of the objective lenses are mounted on the cover 3 on its atmospheric side. A light transmitting glass plate 30 is disposed in the cover 3, through which the light reflected by the reflecting mirror 27 passes. Eyepiece unit 31 is mounted on the cover 3 on the atmospheric side over the glass plate 30. The eyepiece unit 31 comprises an eyepiece 32, a reflecting mirror 33, and a camera mount 34. Light passing through the objective lens 25a is reflected by the reflecting mirrors 27, 33 and directed to the eyepiece 32 for observing a transmission OM image of the specimen 6. When an optical camera is attached to the camera mount 34, the OM image can be photographed.

If the distal end of the specimen moving mechanism 4 is displaced rightward in FIG. 1 for specimen replacement and at the same time the slide support 8 is displaced to the right, the electron beam emitted from the electron gun 11 would irradiate the objective lens 25a directly and cause damage thereto. To prevent such an accident, the apparatus of FIG. 1 has a microswitch 35 for detecting when the glass plate 5 is in a leftward position in the specimen chamber 1. As long as the microswitch 35 remains inactivated, a control circuit 36 connected therewith controls the electron gun power supply 10 so that no electron beam will be emitted from the electron gun 11.

With the apparatus shown in FIG. 1, the objective lens unit 24 and the eyepiece unit 31 of the OM are fixedly mounted on the same cover 3 of the specimen chamber 1, with the result that the positional relationship between the objective lens unit 24 and the eyepiece unit 31 can be precisely established and maintained. The optical axes of the objective lens unit 24 and the eyepiece unit 31 can be held in mutual alignment even if the distance therebetween is very long. Further, for observing larger specimens or vertically moving or tilting the specimen through a large interval, the cover 3 (on which are fixed the OM and the specimen moving mechanism) may be replaced with another cover on which only a larger specimen moving mechanism is installed. Consequently, the operation for switching between a mode of observing both SEM and OM images and another mode can be effected more easily than has been possible with conventional apparatus. The optical axis along which illumination light is transmitted and the optical axis of the OM objective lens unit 24 can be brought into precise alignment, since the slide support 8 and the OM objective lens unit 24 are mounted in the same cover 3. Furthermore, the members, such as the objective lenses, the specimen moving mechanism and eyepiece mounted on the cover 3, when removed from the specimen chamber 1, can be used as an optical microscope.

Figure 2:
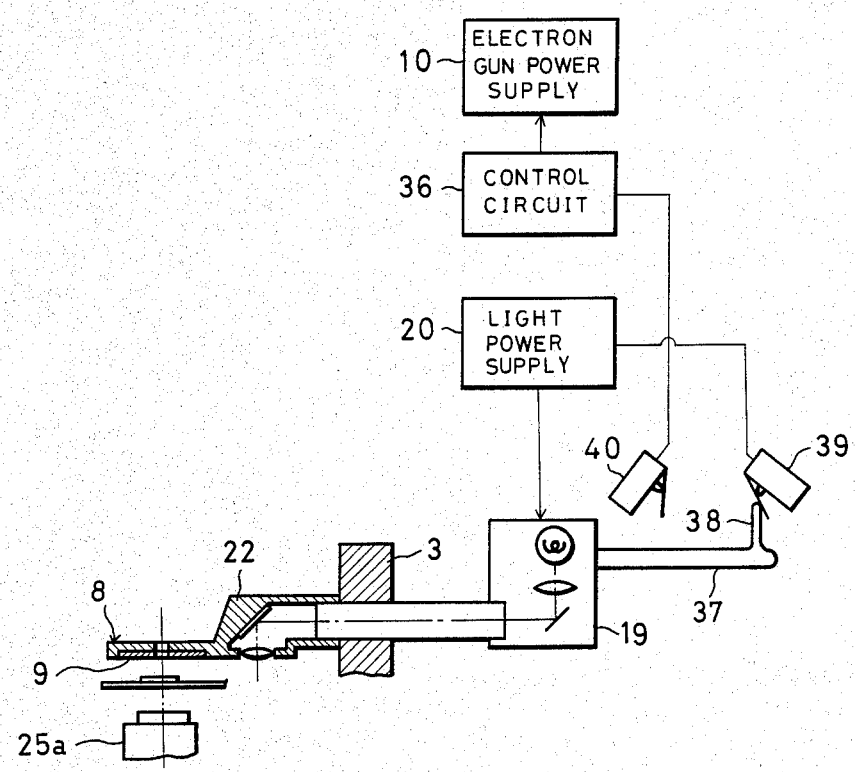
FIGS. 2 through 4 are fragmentary schematic diagrams showing apparatus according to other embodiments of the present invention.

FIG. 2 schematically shows a portion of an apparatus according to another embodiment of the present invention. Identical reference characters in FIG. 2 denote identical parts shown in FIG. 1. A member 37 is attached to the light source 19 and has a projection 38 for selectively turning on microswitches 39, 40. When the slide support 8 is located rightward away from the electron beam optical axis Ze, the microswitch 39 is actuated by the projection 38 to supply the light power supply 20 with a signal for turning off the light power supply 20. This arrangement prevents light from illuminating the electron beam detector 9 producing a noise signal in the case where the electron beam detector 9 is of the type capable of detecting light. When the slide support 8 is slid to the left, the microswitch 40 is turned on to send a signal to the control circuit 36 which then de-energizes the electron gun power supply 10. Accordingly, there is no risk of an electron beam being emitted toward the specimen and damaging the light reflector while an OM image is being observed. While in the illustrated embodiment, the generation of an electron beam is controlled by an output from the microswitch 40, a deflection means may be provided in the electron optical system for deflecting the electron beam in response to an output from the microswitch 40. A deflection means may be provided in the electron optical system for deflecting the electron beam in response to an output from the microswitch 40 to protect the light reflector 22 of the OM against being irradiated with the electron beam.

Figure 3:
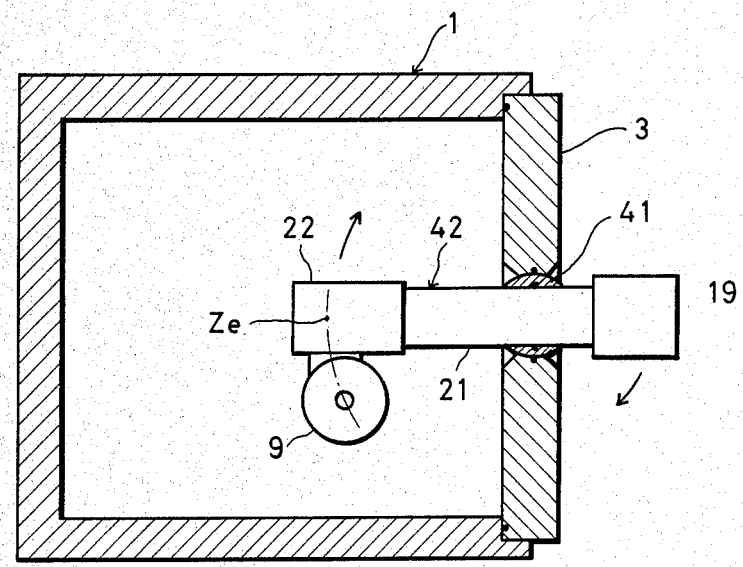

FIG. 3 is a schematic diagram of an apparatus in which the support 42 (replacing support 8 as shown in FIG. 1) is positioned in a different manner. The view is observed along the electron beam optical axis Ze. The support 42 is movably mounted on a front cover 3 of the specimen chamber 1 for angular movement in a plane normal to the electron beam optical axis Ze by means of a cylinder or sphere 41 in a socket provided therefor. The support 42 has on its vacuum end (the end spaced from the cover) a light reflector 22 to which a ring-shaped electron beam detector 9 is attached laterally. The mode of observing SEM images and the mode of observing OM images can be selected one at a time by angularly moving the support 42.

Figure 4:
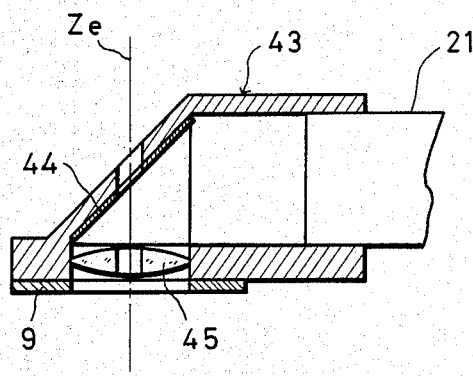

FIG. 4 schematically illustrates a modification of the light reflector 22 of the light illuminating means in the apparatus shown in FIG. 1. A light reflector 43 is composed of a reflecting mirror 44 and a lens 45, both having central holes defined therein for passage of the beam of electrons travelling along the electron beam optical axis Ze. The ring-shaped electron beam detector 9 is attached below and extends around the lens 45. The light reflector 43 allows the operator to observe both OM and SEM images of a specimen at the same time.

Having thus described the invention with the detail and particularity required by the Patent Laws, what is desired protected by Letters Patent is set forth in the following claims.

We claim:

1. A scanning electron microscope comprising:
   (a) a specimen chamber having a removable front cover;
   (b) an electron gun for creating an electron beam;
   (c) means for coverging the electron beam to a spot on a specimen;
   (d) means for scanning the spot of the electron beam over the specimen;
   (e) a detector for generating a signal in response to the electron beam spot scanning over the specimen;
   (f) image means for displaying an image in response to the signal from said detector by modulating a CRT beam scanned in synchronism with the electron beam spot scanning said specimen;
   (g) a specimen moving mechanism for supporting and moving the specimen in the specimen chamber said mechanism being supported from said front cover;
   (h) slide support means for illuminating the specimen with light in the direction in which the electron beam irradiates the specimen, said detector being mounted on said slide support in said specimen chamber for detecting backscattered and/or secondary electrons from the specimen; and
   (i) an optical microscope having an objective lens unit disposed adjacent to the specimen moving mechanism along the optical axis in said specimen chamber for receiving light passed through the specimen, and an eyepiece unit disposed outside of said specimen chamber for receiving the light having passed through said objective lens, said objective lens unit and eyepiece unit supported from said front cover.

2. A scanning electron microscope according to claim 1, wherein said slide support is also mounted on said front cover.

3. A scanning electron microscope according to claim 1, wherein switch means for detecting a position of said slide support in said specimen chamber generates a position signal and the signal is used to prevent illumination of the specimen with light.

4. A scanning electron microscope according to claim 1, wherein said objective lens unit includes a plurality of objective lenses selectively usable under control from outside of said specimen chamber.

5. A scanning electron microscope comprising:
   (a) a specimen chamber having a removable front cover;
   (b) an electron gun for creating an electron beam;
   (c) condenser means for converging said electron beam to a spot on a specimen;
   (d) means for scanning the spot of the electron beam over the specimen;
   (e) a detector for generating a signal in response to the electron beam spot scanning over the specimen;
   (f) image means for displaying an image in response to the signal from said detector by modulating a CRT beam scanned in synchronism with the electron beam spot scanning said specimen;
   (g) a specimen moving mechanism for supporting and moving the specimen in the specimen chamber, said mechanism being supported from said front cover;
   (h) slide support means for illuminating the specimen with light in the direction in which the electron beam irradiates on the specimen, said detector being mounted on said slide support in said specimen chamber for detecting backscattered and/or secondary electrons from the specimen;
   (i) an optical microscope having an objective lens unit adjacent to the specimen moving mechanism along the optical axis disposed in said specimen chamber for receiving light passed through the specimen, and an eyepiece unit disposed outside of said specimen chamber for receiving the light having passed through said objective lens, said objective lens unit and said eyepiece unit mounted on said front cover; and
   (j) protection means comprising means for detecting a position of the specimen moving mechanism and means in response to an output from said detector means for preventing the electron beam from reaching the specimen position.

* * * * *